US007108121B2

(12) United States Patent
Fujimura et al.

(10) Patent No.: US 7,108,121 B2
(45) Date of Patent: Sep. 19, 2006

(54) INTERMEDIATE PRODUCT TRANSFERRING APPARATUS AND CARRYING SYSTEM HAVING THE INTERMEDIATE PRODUCT TRANSFERRING APPARATUS

(75) Inventors: Hisashi Fujimura, Chino (JP); Shuji Tanaka, Chino (JP); Yoshitake Kobayashi, Shiojiri (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/793,648

(22) Filed: Mar. 4, 2004

(65) Prior Publication Data

US 2004/0247417 A1 Dec. 9, 2004

(30) Foreign Application Priority Data

Mar. 12, 2003 (JP) ............................ 2003-067294

(51) Int. Cl.
*B65G 37/00* (2006.01)
*H01L 21/68* (2006.01)

(52) U.S. Cl. .................................................. 198/347.1

(58) Field of Classification Search ............ 198/347.1; 414/222.01

See application file for complete search history.

(56) References Cited

U.S. PATENT DOCUMENTS 5,536,128 A * 7/1996 Shimoyashiro et al. ..... 414/273

FOREIGN PATENT DOCUMENTS

| | | |
|---|---|---|
| JP | 62-48038 | 3/1987 |
| JP | 2-78243 | 3/1990 |
| JP | 2-117512 | 5/1990 |
| JP | 6-310424 | 11/1994 |
| JP | 2001-358194 | 12/2001 |
| JP | 2002-059324 | 2/2002 |
| JP | 2002-237512 | 8/2002 |
| JP | 2002-334917 | 11/2002 |
| KR | 2003-29850 | 4/2003 |
| WO | WO 02/059738 | 8/2002 |
| WO | WO 02/059961 | 8/2002 |
| WO | 2003/000472 | 1/2003 |

OTHER PUBLICATIONS

Patent Abstracts of Japan regarding Publication No. 06-310424, published Nov. 4, 1994.

Patent Abstracts of Japan regarding Publication No. 62-048038, published Mar. 2, 1987.

Patent Abstracts of Japan regarding Publication No. 02-078243, published Mar. 19, 1990.

Patent Abstracts of Japan regarding Plublication No. 02-117512, published May 2, 1990.

Patent Abstracts of Japan regarding Publication No. 2001-358194, published Dec. 26, 2001.

(Continued)

*Primary Examiner*—Douglas A. Hess
(74) *Attorney, Agent, or Firm*—Harness, Dickey & Pierce, P.L.C.

(57) ABSTRACT

An intermediate product transferring apparatus is provided for transferring an intermediate product W between a single-wafer carrying line for carrying the intermediate product W in a single-wafer manner and a manufacturing apparatus for manufacturing the intermediate product W includes a transferring robot for transferring the intermediate product W between the single-wafer carrying line and the manufacturing apparatus; and a buffer for temporarily storing the intermediate product W which is transferred from the single-wafer carrying line by the transferring robot or the intermediate product W which is processed by the manufacturing apparatus.

8 Claims, 14 Drawing Sheets

23(24~28)
PROCESSING APPARATUS
LOAD PORT (AUXILIARY PORT) 33
INTERMEDIATE PRODUCT TRANSFERRING APPARATUS13
T
35A
TRANSFER ROBOT 21
BUFFER 34
MAIN BODY 35
W
CARRYING SYSTEM 11
PLATFORM 46
TRANSFERRING DIRECTION T
SINGLE-WAFER CARRYING CONVEYOR (SINGLE WAFER CARRYING LINE) 20

FIRST EMBODIMENT

OTHER PUBLICATIONS

Patent Abstracts of Japan regarding Publication No. 2002-237512, published Aug. 23, 2002.

Patent Abstracts of Japan regarding Publication No. 2002-334917, published Nov. 22, 2002.

Comments/Abstract regarding Taiwan Patent Application No. 87118839 (Jul. 1, 2000).

Communication from Taiwan Patent Office regarding counterpart application.

* cited by examiner

INTERMEDIATE PRODUCT TRANSFERRING APPARATUS AND CARRYING SYSTEM HAVING THE INTERMEDIATE PRODUCT TRANSFERRING APPARATUS

RELATED APPLICATIONS

This application claims priority to Japanese Patent Application No. 2003-067294 filed Mar. 12, 2003 which is hereby expressly incorporated by refere3nce herein in its entirety.

BACKGROUND OF THE INVENTION

1. Technical Field of the Invention

The present invention relates to an intermediate product transferring apparatus for transferring an intermediate product such as a semiconductor wafer, for example, and a carrying system having the intermediate product transferring apparatus.

2. Description of the Related Art

Semiconductor manufacturing apparatuses for manufacturing a semiconductor wafer (hereinafter, referred to as a wafer) include, for example, a lithography apparatus, a film forming apparatus, an etching apparatus, a cleaning apparatus, an inspection apparatus, and various kinds of wafer manufacturing apparatuses.

In manufacturing semiconductor devices, the wafers are moved among these wafer manufacturing apparatuses, and processed in the manufacturing apparatuses, whereby the manufacturing processes are performed.

Wafer cassettes are used for moving the wafers between these wafer manufacturing apparatuses. The wafer cassettes detachably accommodate a plurality of wafers. The plurality of wafers is accommodated in the wafer cassettes in accordance with lots requested from a process carrying system (for example, see Japanese Unexamined Patent Application Publication No. 62-48038 (see page 2 and FIG. 1)).

Instead of carrying the wafer in accordance with the wafer cassette approach, the so-called single-wafer carrying approach of carrying wafers on a conveyer one-by-one in accordance with a request for limited production of a wide variety of wafers has been suggested. The single-wafer carrying approach is intended to be adapted to the limited production of a variety of wafers (for example, see Japanese Unexamined Patent Application Publication No. 2002-334917 (see page 1 and FIG. 1)).

However, there are the following problems in the so-called single-wafer carrying approach.

The wafers, which are transferred one-by-one by the conveyor, are subject to transfer between a plurality of the manufacturing apparatuses by a robot. However, if the number of wafers that are transferred by the conveyor is not equal to the number of wafers that can be processed in the manufacturing apparatuses, the supplied wafers are not smoothly processed in the manufacturing apparatuses. For this reason, the productivity of the wafers is deteriorated, and thus, there is a problem that the production efficiency of the wafer can decrease.

Accordingly, an object of the present invention is to solve the problem and to provide an intermediate product transferring apparatus for rapidly and accurately transferring an intermediate product between a single-wafer carrying line for carrying an intermediate product such as a wafer and a manufacturing apparatus for manufacturing the intermediate product, and a carrying system having the intermediate product transferring apparatus.

SUMMARY

According to an aspect of the present invention, there is an intermediate product transferring apparatus for transferring an intermediate product between a single-wafer carrying line for carrying the intermediate product in a single-wafer manner and a manufacturing apparatus for manufacturing the intermediate product comprising: a transferring robot for transferring the intermediate product between the single-wafer carrying line and the manufacturing apparatus; and a buffer for temporarily storing the intermediate product which is transferred from the single-wafer carrying line by the transferring robot or the intermediate product which is processed by the manufacturing apparatus.

According to the construction, the transferring robot transfers the intermediate product between the single-wafer carrying line and the manufacturing apparatus. The buffer temporarily stores the intermediate product that is transferred from the single-wafer carrying line by the transferring robot or the intermediate product that is processed by the manufacturing apparatus.

As a result, the intermediate product, which is transferred from the single-wafer carrying line by the transferring robot, is temporarily stored in the buffer, whereby the time when the intermediate product is sent to the manufacturing apparatus can be delayed. Similarly, the intermediate product, which is processed by the manufacturing apparatus, is temporarily stored in the buffer, whereby the time when the processed intermediate product is sent to the carrying line by the transferring robot can be delayer.

Accordingly, in the transferring (delivering) of the intermediate product between the single-wafer carrying line and the manufacturing apparatus, even in the case that the number of intermediate products which are carried by the single-wafer carrying line is different from the number of intermediate products which are able to be processed in the manufacturing apparatuses, the transferring of the intermediate product can be rapidly and accurately performed.

Furthermore, since the intermediate product transferred from the single-wafer carrying line by the transferring robot, or the intermediate product processed by the manufacturing apparatus is temporarily stored in the buffer, the single-wafer carrying line need not be stopped, whereby it is possible to prevent the carrying capability from being lowered. Since the manufacturing apparatus can manufacture the intermediate products in accordance with the process capability of the manufacturing apparatus, it is possible to continuously perform production without the productivity being deteriorated and the production efficiency being lowered.

In the aforementioned aspect of the present invention, it is preferable that the intermediate product is an electronic component manufacturing substrate or a wafer for a substrate, the buffer is a shelf-shaped structure, which is capable of accommodating a plurality of the intermediate products and is disposed near the transferring robot.

According to the construction, the intermediate product is an electronic component manufacturing substrate or a wafer for a substrate. The buffer is a shelf-shaped structure. The shelf-shaped structure is capable of detachably accommodating, for example, a plurality of the intermediate products, disposed near the transferring robot.

As a result, since the buffer is disposed near the transferring robot, the area occupied by the intermediate product transferring apparatus can be extremely reduced.

In the aforementioned aspect of the present invention, it is preferable that the intermediate product transferring apparatus further comprise an auxiliary port for mounting the intermediate product, and the auxiliary port is disposed near the transferring robot.

According to the construction, the auxiliary port for mounting a container capable of detachably accommodating a plurality of the intermediate products, for example, is further provided. For example, a container, in which a plurality of the intermediate products is accommodated, is manually mounted on the auxiliary port by an operator.

An instance of using the auxiliary port includes, for example, a case that some failure occurs in the single-wafer carrying line and a case that a check operation is performed after adjustment of the apparatus. In these cases, the operator manually mounts the container, in which the plurality of the intermediate products is accommodated, on the auxiliary port. As a result, the transferring robot can transfer the intermediate products from the container mounted on the auxiliary port to the manufacturing apparatus.

According to another aspect of the present invention, there is an intermediate product transferring apparatus for transferring an intermediate product between a single-wafer carrying line for carrying the intermediate product in a single-wafer manner and an intermediate product delivering apparatus which is previously attached to a manufacturing apparatus for manufacturing the intermediate product comprising: a transferring robot for transferring the intermediate product between the single-wafer carrying line and the intermediate product delivering apparatus; and a buffer for temporarily storing the intermediate product which is transferred from the single-wafer carrying line by the transferring robot or the intermediate product which is processed by the manufacturing apparatus.

According to the construction, the intermediate product transferring apparatus can rapidly and accurately transfer the intermediate products between the single-wafer carrying line and the intermediate product delivering apparatus that is previously attached to the manufacturing apparatus.

The transferring robot transfers the intermediate products between the single-wafer carrying line and the intermediate product delivering apparatus. The buffer temporarily stores the intermediate product that is transferred from the single-wafer carrying line by the transferring robot or the intermediate product that is processed by the manufacturing apparatus.

As a result, the intermediate product, which is transferred from the single-wafer carrying line by the transferring robot, is temporarily stored in the buffer, whereby the time when the intermediate product is sent to the delivering apparatus of the manufacturing apparatus can be delayed. Similarly, the intermediate product, which is processed by the manufacturing apparatus, is temporarily stored in the buffer, whereby the time when the completely processed intermediate product is sent to the carrying line by the transferring robot can be delayed.

Accordingly, in the transferring (delivering) of the intermediate product between the single-wafer carrying line and the delivering apparatus of the manufacturing apparatus, even in the case that the number of intermediate products which are carried by the single-wafer carrying line is different from the number of intermediate products which are able to be processed in the manufacturing apparatuses, the transferring of the intermediate product can be rapidly and accurately performed. Furthermore, since the intermediate product transferred from the single-wafer carrying line by the transferring robot, or the intermediate product processed by the manufacturing apparatus is temporarily stored in the buffer, the single-wafer carrying line need not be stopped, whereby it is possible to prevent the carrying capability from being lowered. Since the manufacturing apparatus can manufacture the intermediate products in accordance with the process capability of the manufacturing apparatus, it is possible to continuously perform production without the productivity being deteriorated and the production efficiency being lowered.

In the aforementioned aspect of the present invention, it is preferable that the intermediate product be an electronic component manufacturing substrate or a wafer for a substrate, the buffer be a shelf-shaped structure which is capable of accommodating a plurality of the intermediate products, and the buffer be disposed near the transferring robot.

According to the construction, the intermediate product is an electronic component manufacturing substrate or a wafer for a substrate. The buffer is a shelf-shaped structure. The structure is capable of detachably accommodating, for example, a plurality of the intermediate products, and is disposed near the transferring robot.

As a result, since the buffer is disposed near the transferring robot, the area occupied by the intermediate product transferring apparatus can be extremely reduced.

In the aforementioned aspect of the present invention, it is preferable that the intermediate product transferring apparatus further comprise an auxiliary port for mounting a container capable of accommodating a plurality of the intermediate products, and the auxiliary port be disposed near the transferring robot.

According to the construction, the auxiliary port for mounting a container capable of accommodating a plurality of the intermediate products, for example, is further provided. For example, a container, in which a plurality of the intermediate products is accommodated, is manually mounted on the auxiliary port by an operator.

An instance of using the auxiliary port includes, for example, a case that some failure occurs in the single-wafer carrying line and a case that a check operation is performed after adjustment of the apparatus. In these cases, the operator manually mounts the container, in which the intermediate products are accommodated, on the auxiliary port. As a result, the transferring robot can transfer the intermediate products from the container mounted on the auxiliary port to the manufacturing apparatus.

According to another aspect of the present invention, there is a carrying system having an intermediate product transferring apparatus for transferring an intermediate product between a carrying line for carrying the intermediate product and a manufacturing apparatus for manufacturing the intermediate product comprising: a single-wafer carrying line for carrying the intermediate product in a single-wafer manner; and a transferring apparatus for transferring the intermediate product between the single-wafer carrying line and the manufacturing apparatus for manufacturing the intermediate product, wherein the transferring apparatus for transferring the intermediate product comprises: a transferring robot for transferring the intermediate product between the single-wafer carrying line and the manufacturing apparatus; and a buffer for temporarily storing the intermediate product which is transferred from the single-wafer carrying line by the transferring robot or the intermediate product which is processed by the manufacturing apparatus.

According to the construction, the transferring robot transfers the intermediate product between the single-wafer carrying line and the manufacturing apparatus. The buffer temporarily stores the intermediate product that is transferred from the single-wafer carrying line by the transferring robot or the intermediate product that is processed by the manufacturing apparatus.

As a result, the intermediate product, which is transferred from the single-wafer carrying line by the transferring robot, is temporarily stored in the buffer, whereby the time when the intermediate product is sent to the manufacturing apparatus can be delayed. Similarly, the intermediate product, which is processed by the manufacturing apparatus, is temporarily stored in the buffer, whereby the time when the processed intermediate product is sent to the carrying line by the transferring robot can be delayed.

Accordingly, in the transferring (delivering) of the intermediate product between the single-wafer carrying line and the manufacturing apparatus, even in the case that the number of intermediate products which are carried by the single-wafer carrying line is different from the number of intermediate products which are able to be processed in the manufacturing apparatuses, the transferring of the intermediate product can be rapidly and accurately performed.

Furthermore, since the intermediate product transferred from the single-wafer carrying line by the transferring robot, or the intermediate product processed by the manufacturing apparatus is temporarily stored in the buffer, the single-wafer carrying line need not be stopped, whereby it is possible to prevent the carrying capability from being lowered. Since the manufacturing apparatus can manufacture the intermediate products in accordance with the process capability of the manufacturing apparatus, it is possible to continuously perform production without the productivity being deteriorated and the production efficiency being lowered.

According to another aspect of the present invention, there is a carrying system having an intermediate product transferring apparatus for transferring an intermediate product between a carrying line for carrying the intermediate product and an intermediate product delivering apparatus which is attached to a manufacturing apparatus for manufacturing the intermediate product comprising: a single-wafer carrying line for carrying the intermediate product in a single-wafer manner; and a transferring apparatus for transferring the intermediate product between the single-wafer carrying line and intermediate product delivering apparatus, wherein the transferring apparatus for transferring the intermediate product comprises: a transferring robot for transferring the intermediate product between the single-wafer carrying line and the intermediate product delivering apparatus; and a buffer for temporarily storing the intermediate product which is transferred from the single-wafer carrying line by the transferring robot or the intermediate product which is processed by the manufacturing apparatus.

According to the construction, the intermediate product transferring apparatus can rapidly and accurately transfer the intermediate products between the single-wafer carrying line and the intermediate product delivering apparatus that is previously attached to the manufacturing apparatus.

The transferring robot transfers the intermediate products between the single-wafer carrying line and the intermediate product delivering apparatus. The buffer temporarily stores the intermediate product that is transferred from the single-wafer carrying line by the transferring robot or the intermediate product that is processed by the manufacturing apparatus.

As a result, the intermediate product, which is transferred from the single-wafer carrying line by the transferring robot, is temporarily stored in the buffer, whereby the time when the intermediate product is sent to the delivering apparatus of the manufacturing apparatus can be delayed. Similarly, the intermediate product, which is processed by the manufacturing apparatus, is temporarily stored in the buffer, whereby the time when the processed intermediate product is sent to the carrying line by the transferring robot can be delayed.

Accordingly, in the transferring (delivering) of the intermediate product between the single-wafer carrying line and the delivering apparatus of the manufacturing apparatus, even in the case that the number of intermediate products which are carried by the single-wafer carrying line is different from the number of intermediate products which are able to be processed in the manufacturing apparatuses, the transferring of the intermediate product can be rapidly and accurately performed. Furthermore, since the intermediate product transferred from the single-wafer carrying line by the transferring robot, or the intermediate product processed by the manufacturing apparatus is temporarily stored in the buffer, the single-wafer carrying line need not be stopped, whereby it is possible to prevent the carrying capability from being lowered. Since the manufacturing apparatus can manufacture the intermediate products in accordance with the process capability of the manufacturing apparatus, it is possible to continuously perform production without the productivity being deteriorated and the production efficiency being lowered.

DETAILED DESCRIPTION

Hereinafter, preferred embodiments of the present invention will be described with reference to the accompanying drawings.

Figure 1:
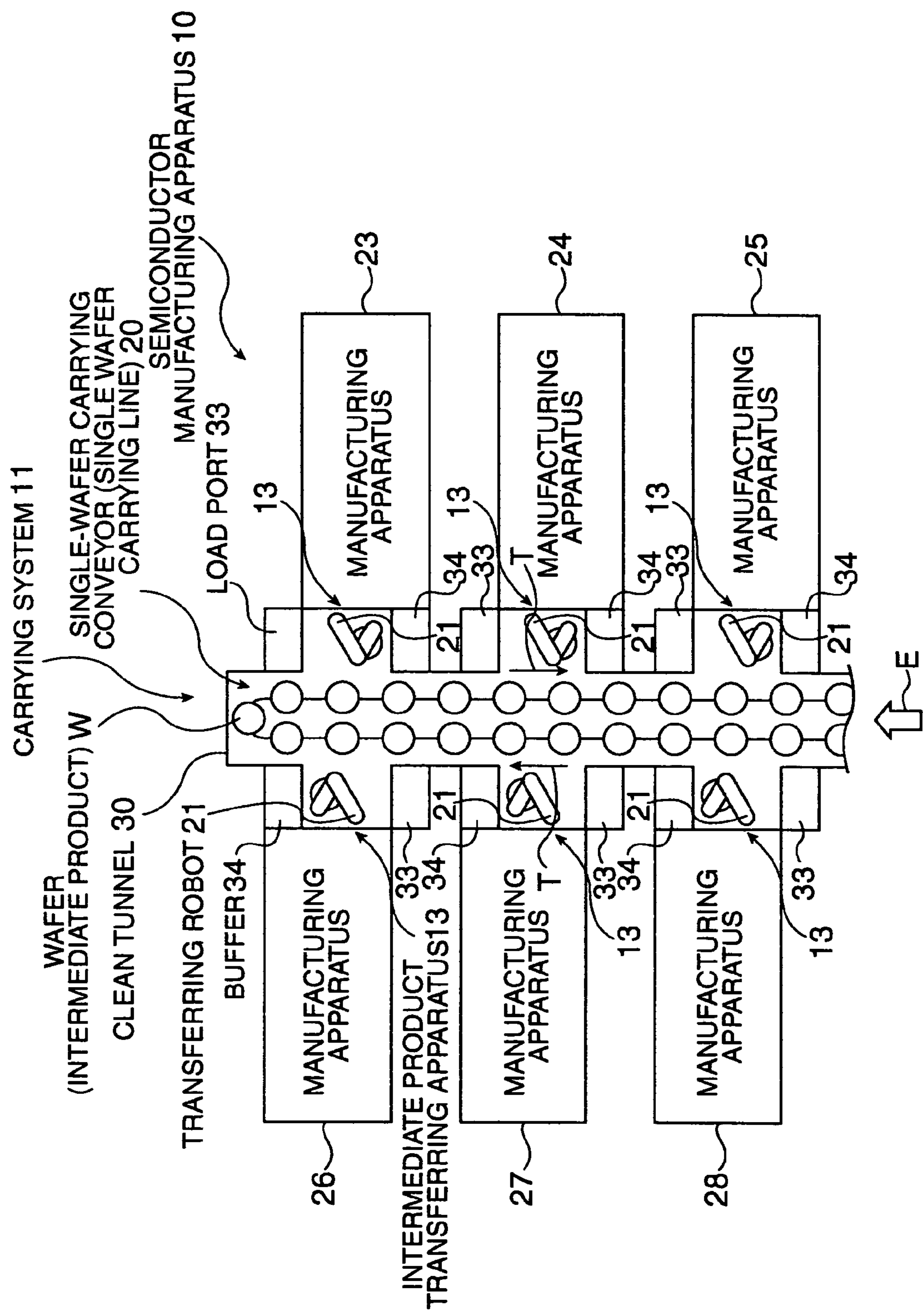
FIG. 1 is a plan view illustrating a semiconductor manufacturing apparatus comprising a carrying system having an intermediate product transferring apparatus according to the present invention.
Figure 2:
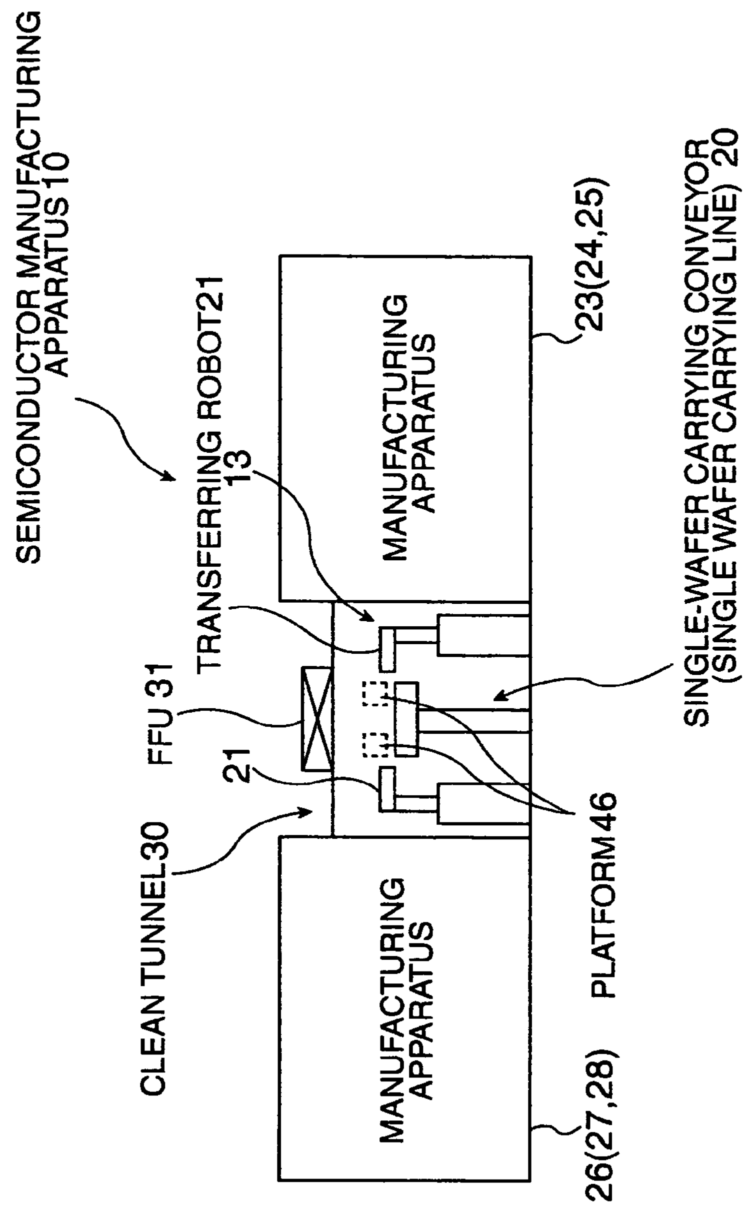
FIG. 2 is a side view of the semiconductor manufacturing apparatus of FIG. 1 as viewed at a direction E.

FIG. 1 is a plan view illustrating a carrying system having an intermediate product transferring apparatus and a plurality of manufacturing apparatuses that are provided near the carrying system. FIG. 2 is a side view of the carrying system and the manufacturing apparatuses as viewed in the direction E of FIG. 1.

Referring to FIG. 1, a semiconductor manufacturing apparatus 10 comprise the carrying system 11 and the plurality of manufacturing apparatuses 23 to 28, for example.

The carrying system 11 shown in FIG. 1 comprises a plurality of intermediate product transferring apparatuses 13. The intermediate product transferring apparatuses 13 are disposed at locations corresponding to the manufacturing apparatuses 23 to 28. The carrying system 11 comprises a single-wafer carrying conveyor 20 and the plurality of the intermediate product transferring apparatuses 13. All of the intermediate product transferring apparatuses 13 have the same construction.

In FIGS. 1 and 2, the semiconductor manufacturing apparatus 10 is an apparatus for manufacturing a wafer W as an intermediate product. Accordingly, the transferring product, which is transferred by the carrying system 11, is the wafer W.

The manufacturing apparatuses 23 to 28 (which may be referred to as a production apparatus or processing apparatus) shown in FIGS. 1 and 2 may include, for example, a lithography apparatus, a film forming apparatus, an etching apparatus, a cleaning apparatus, an inspection apparatus, and various kinds of wafer manufacturing apparatuses, and the apparatuses are disposed according to a desired sequence.

The single-wafer carrying conveyor 20 may be referred to as a single-wafer carrying line. The single-wafer carrying conveyor 20 is partitioned by a clean tunnel 30. The clean tunnel 30 is provided in order to partition a portion, in which the wafer W is passed through, as a very small closed space.

The clean tunnel 30 comprises fan-attached filter units (FFUs) 31. The fan-attached filter units 31 are disposed at the ceiling of the clean tunnel 30. The fan-attached filter units 31 generate air flow (down flow) from the ceiling to the floor of the clean tunnel. As a result, dust in the air is removed, so that the interior of the clean tunnel 30 can be controlled at a prescribed cleanliness level (cleanliness class).

As described above, all of the intermediate product transferring apparatuses 13 shown in FIG. 1 have the same construction. Therefore, in the following description, the construction of one intermediate product transferring apparatus 13 will be described with reference to FIGS. 3 to 8.

FIRST EMBODIMENT

FIGS. 3 to 8 illustrate a first embodiment of an intermediate product transferring apparatus 13 of the present invention.

Figure 3:
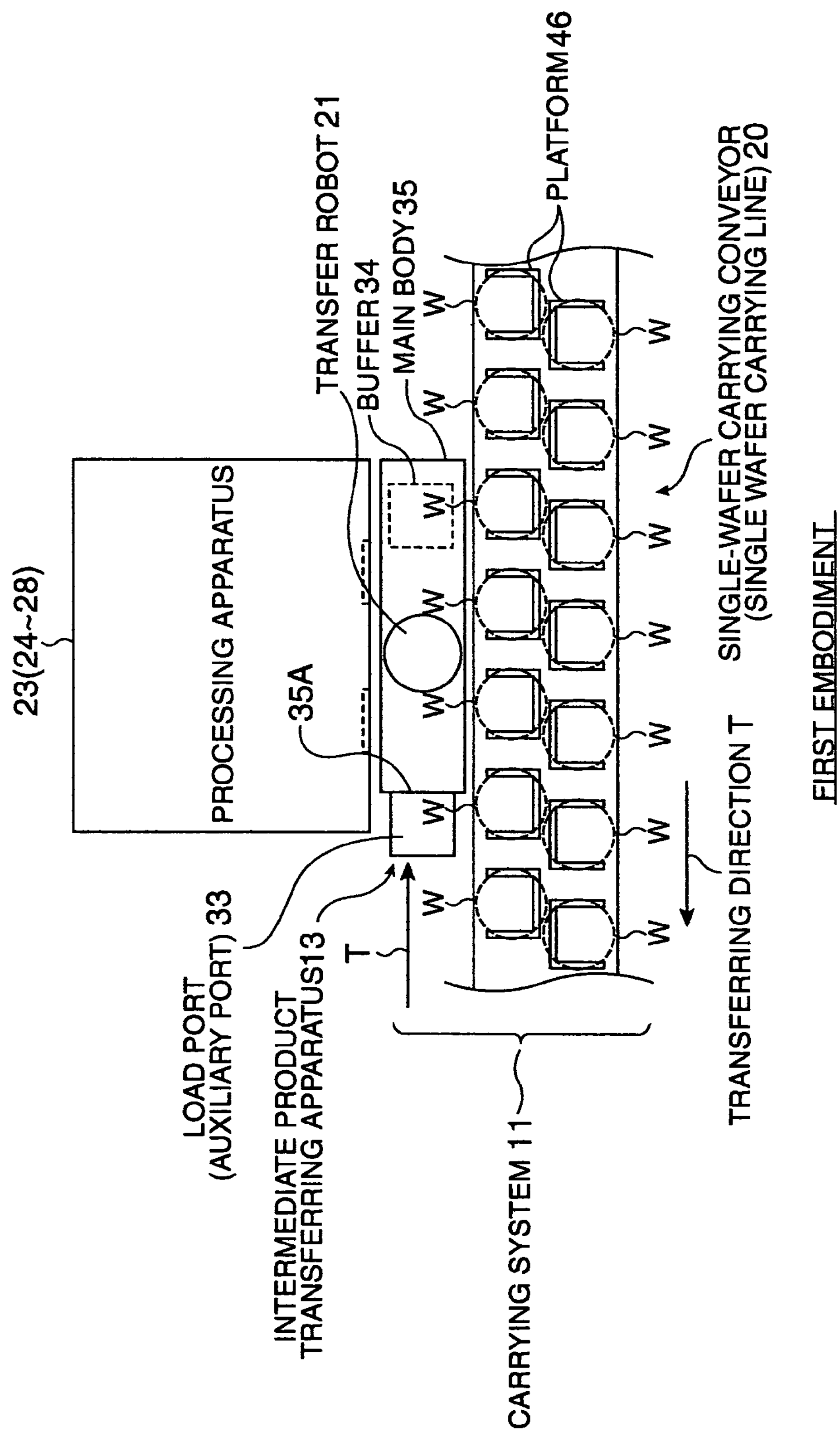
FIG. 3 is a plan view illustrating a first embodiment of the present invention.
Figure 4:
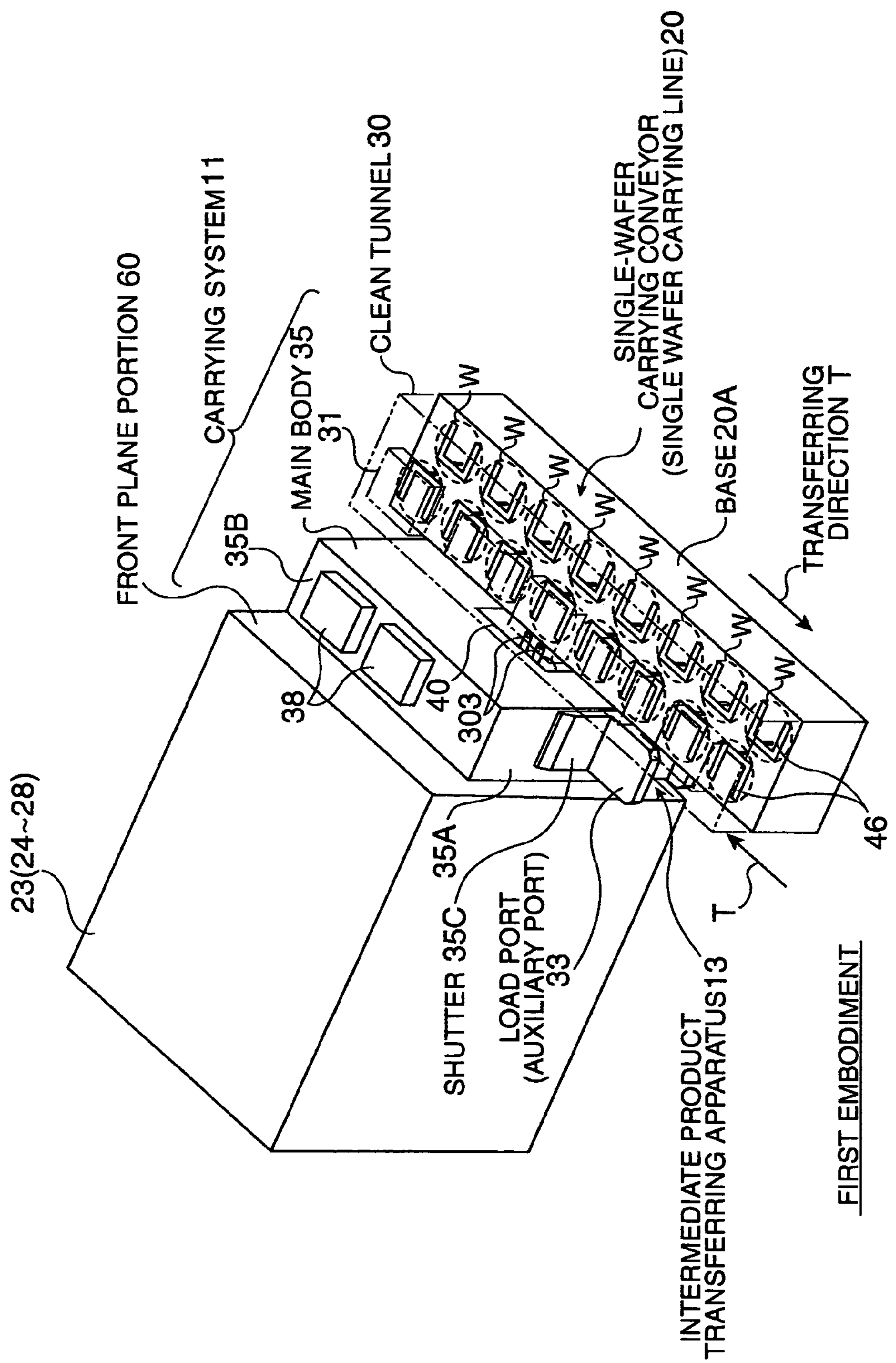
FIG. 4 is a perspective view illustrating the first embodiment.
Figure 5:
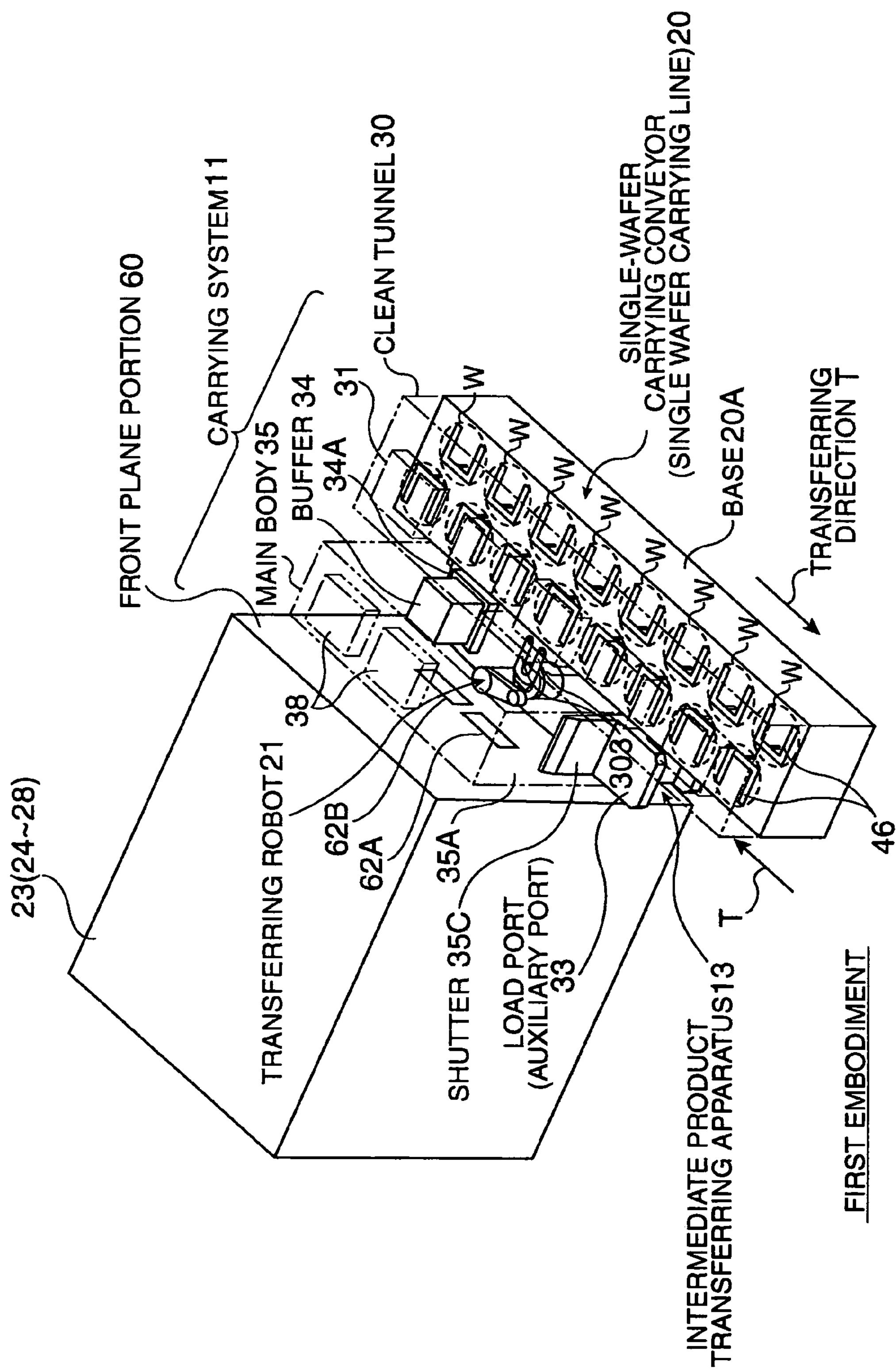
FIG. 5 is a perspective view illustrating the first embodiment some parts of which are omitted.

FIG. 3 is a plan view representatively illustrating the intermediate product transferring apparatus 13 and one manufacturing apparatus 23. FIGS. 4 and 5 are perspective views representatively illustrating the intermediate product transferring apparatus 13 and one manufacturing apparatus 23.

In FIGS. 3 to 5, the intermediate product transferring apparatus 13 comprises a transferring robot 21, a buffer 34, a load port (a kind of an auxiliary port) 33, and a main body 35.

The main body 35 is disposed between the manufacturing apparatus 23 and the single-wafer carrying conveyor 20. The aforementioned transferring robot 21 and buffer 34 are accommodated in the main body 35.

The load port 33 is disposed to protrude laterally from one side 35A of the main body 35. The protruding direction of the load port 33 is parallel to the carrying direction T of the single-wafer carrying conveyor 20.

FIGS. 4 and 5 illustrate the construction of the intermediate product transferring apparatus 13 of FIG. 3 in detail. The intermediate product transferring apparatus 13 and the single-wafer carrying conveyor 20 constitute the carrying system 11. In FIG. 4, an outer surface of the main body 35 and the load port 33 of the intermediate product transferring apparatus 13 are illustrated. In FIG. 5, the main body 35 is illustrated with a two-dot-dashed line, and the transferring robot 21 and the buffer 34 accommodated in the main body 35 are illustrated.

As shown in FIG. 4, fan-attached filter units (FFUs) 38 are attached on the top 35B of the main body 35. In the main body 35, the transferring robot 21 and the buffer 34 are accommodated in a very small-enclosed space. The fan-attached filter units 38 generate air flow (down flow) from the top portion 35B of the main body 35 to the lower side thereof, which is within the main body 35. As a result, dust in the air in the main body 35 is removed, so that the interior of the main body 35 can be controlled at a prescribed cleanliness level (cleanliness class).

The main body 35 shown in FIG. 4 comprises an opening 40 at a location facing the single-wafer carrying conveyor 20. The opening 40 is provided at a location corresponding to the transferring robot 21 and facing the single-wafer carrying conveyor 20.

Next, a constructional example of the transferring robot 21 shown in FIGS. 3 and 5 will be described.

Figure 6:
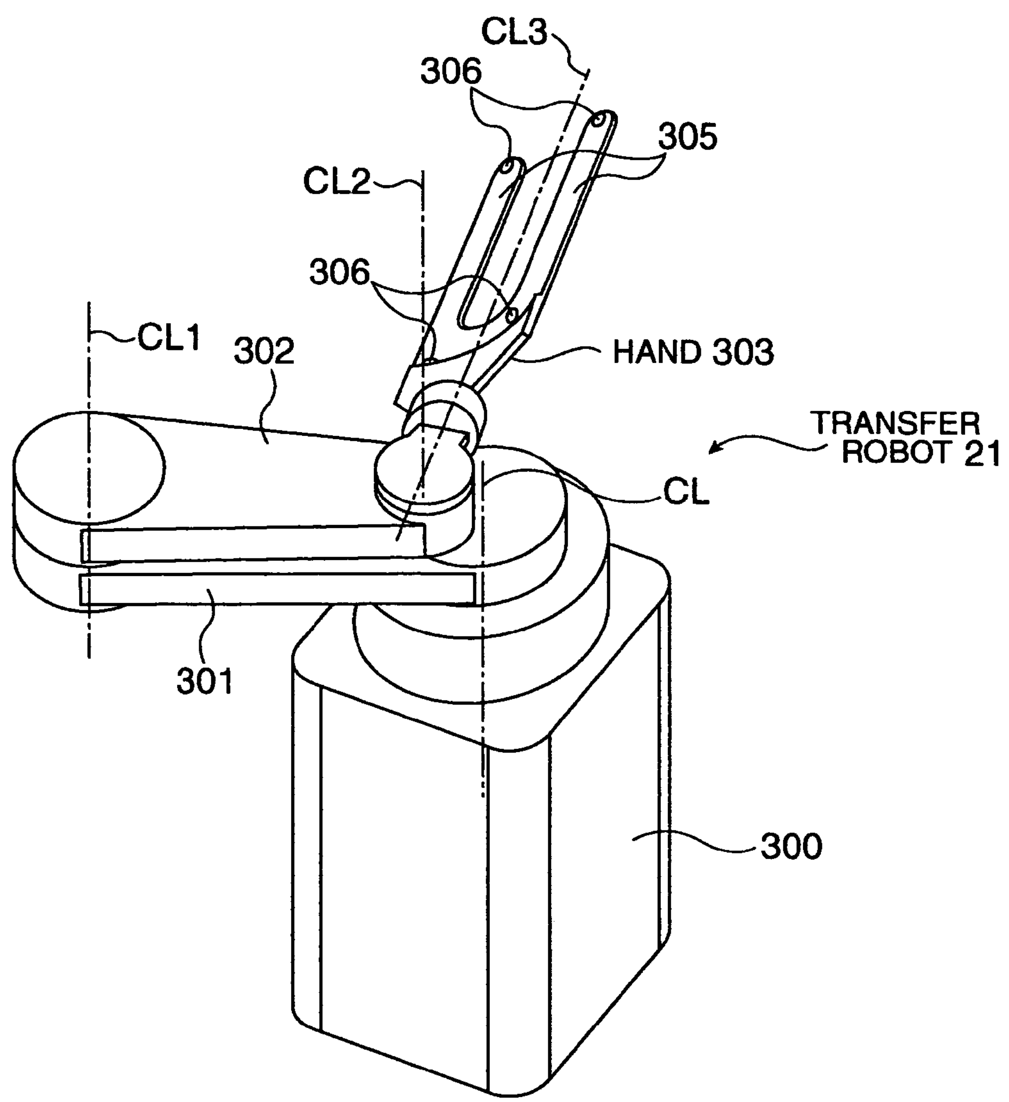
FIG. 6 is a perspective view illustrating an example of a transferring robot.
Figure 7:
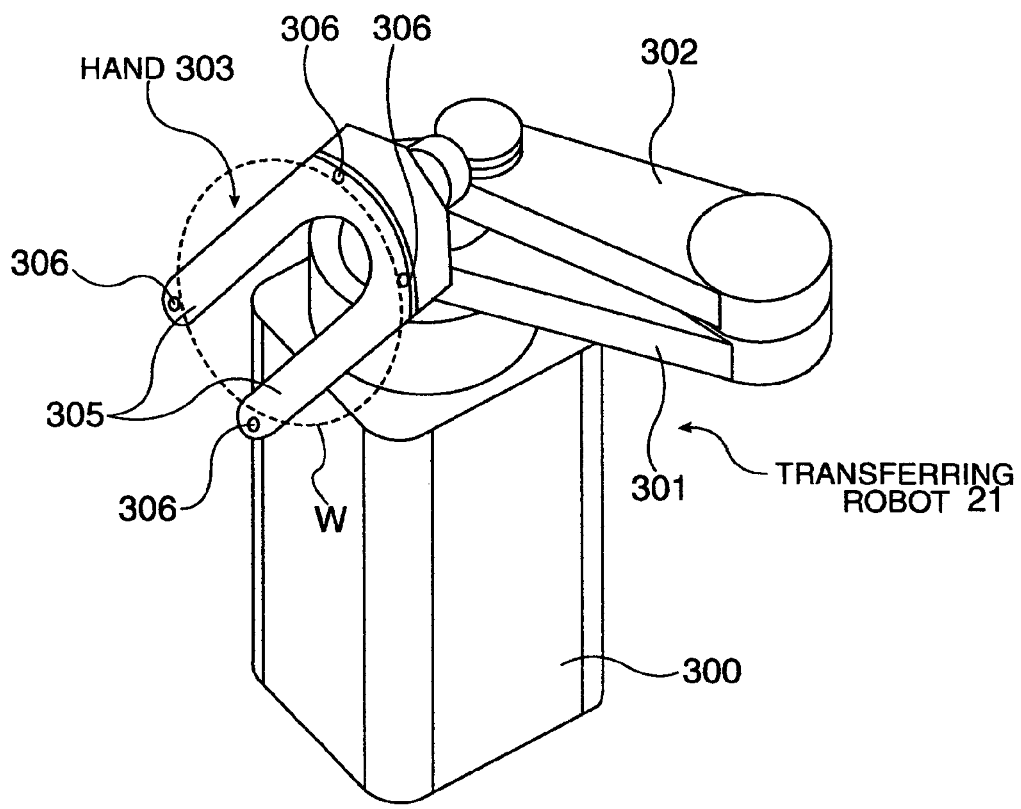
FIG. 7 is a view illustrating the transferring robot as viewed at another angle.

The detailed constructional example of the transferring robot 21 is illustrated in FIGS. 6 and 7 in detail.

The transferring robot 21 is a robot for transferring the wafer W, that is, an intermediate product, between the single-wafer carrying line 20 and the manufacturing apparatus 23. As shown in FIG. 5, the transferring robot 21 is disposed between the load port 33 and the buffer 34. Furthermore, the transferring robot 21 is disposed between the manufacturing apparatus 23 and the single-wafer carrying line 20.

The transferring robot 21, which is shown in FIGS. 6 and 7 in detail, comprises a main body 300, a first arm 301, a second arm 302, and a hand 303. The first arm 301 can rotate around a central axis CL of the main body 300. The second arm 302 can rotate around a rotary axis CL1 with respect to the first arm 301. The hand 303 can rotate around a rotary axis CL2 and a rotary axis CL3.

The hand 303 comprises arm portions 305 and 305 which constitute a substantially U-shaped arm. Each of the arm portions 305 and 305 has a support member 306 for supporting an outer circumferential edge of the wafer W.

Figure 8:
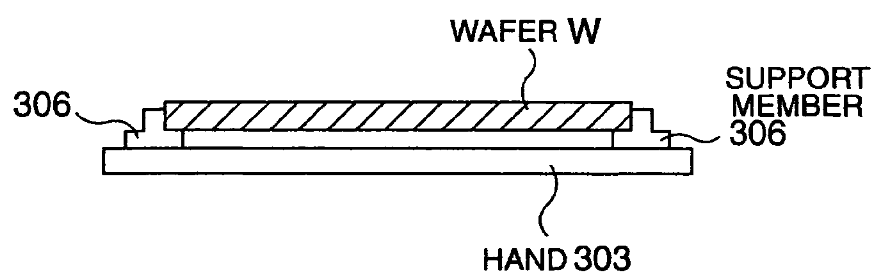
FIG. 8 is a view illustrating a hand of the transferring robot and a wafer.

FIG. 8 illustrates the hand 303 of the robot 21 shown in FIGS. 6 and 7. The support members 306 of the hand 303 support the outer circumferential edge of the wafer W.

Next, the buffer 34 shown in FIGS. 3 and 5 will be described.

The buffer 34 may be referred to as a mini buffer. The buffer 34 is disposed between the manufacturing apparatus 23 and the single-wafer carrying conveyor 20. The buffer 34 is provided on a setting portion 34A shown in FIG. 5. The buffer 34 detachably accommodates a plurality of wafers. The buffer 34 temporarily stores the wafer W which is carried one-by-one from the single-wafer carrying conveyor 20 by the transferring robot 21. In addition, the buffer 34 has a function of temporarily storing the wafer W which is manufactured or processed by the manufacturing apparatus 23.

The aforementioned transferring robot 21 and buffer 34 are disposed in an enclosed space of the main body 35. The enclosed space has the function of locally improving cleanliness.

Next, the load port 33 shown in FIGS. 3 to 5 will be described.

The load port 33 is disposed at the one side 35A of the main body 35. An openable shutter 35C is disposed at the side 35A of the main body 35. By opening and closing the shutter 35C, the wafer W loaded on the load port 33 can be inserted from a container for detachably accommodating the plurality of the wafers W to the main body 35 by the transferring robot 21 or ejected from the main body 35 to the load port 33 by the transferring robot 21.

A load-lock chamber inlet 62A and an unload-lock chamber inlet 62B are provided at the front plane portion 60 of the manufacturing apparatus 23. The transferring robot 21 sends the wafer through the inlet 62A to the manufacturing apparatus 23. In addition, the transferring robot 21 takes out the wafer W, which is processed by the manufacturing apparatus 23, through the inlet 62B from the manufacturing apparatus 23.

Next, a constructional example of the single-wafer carrying conveyor 20 shown in FIGS. 3 to 5 will be described.

The single-wafer carrying conveyor 20 comprises a base 20A and a plurality of wafer holding members 46. The plurality of the wafer holding members 46 is disposed along the carrying direction T on the base 20A. The wafer holding members 46 are sent along the carrying direction T in an endless shape. The wafers W are loaded on the wafer holding members 46. The wafer holding members 46 are arranged at equal intervals along the carrying direction T and can be moved along the carrying direction T in an endless shape by a driving unit (not shown).

As shown in FIGS. 4 and 5, the clean tunnel 30 is provided on the base 20A. The fan-attached filter units 31 are disposed on the clean tunnel 30. The fan-attached filter units 31 generate air flow (down flow) in order to improve the cleanliness of the enclosed space that is provided in the clean tunnel 30. As a result, dust in the air in the clean tunnel 30 is removed, so that the clean tunnel can be controlled at a prescribed cleanliness level.

Figure 9:
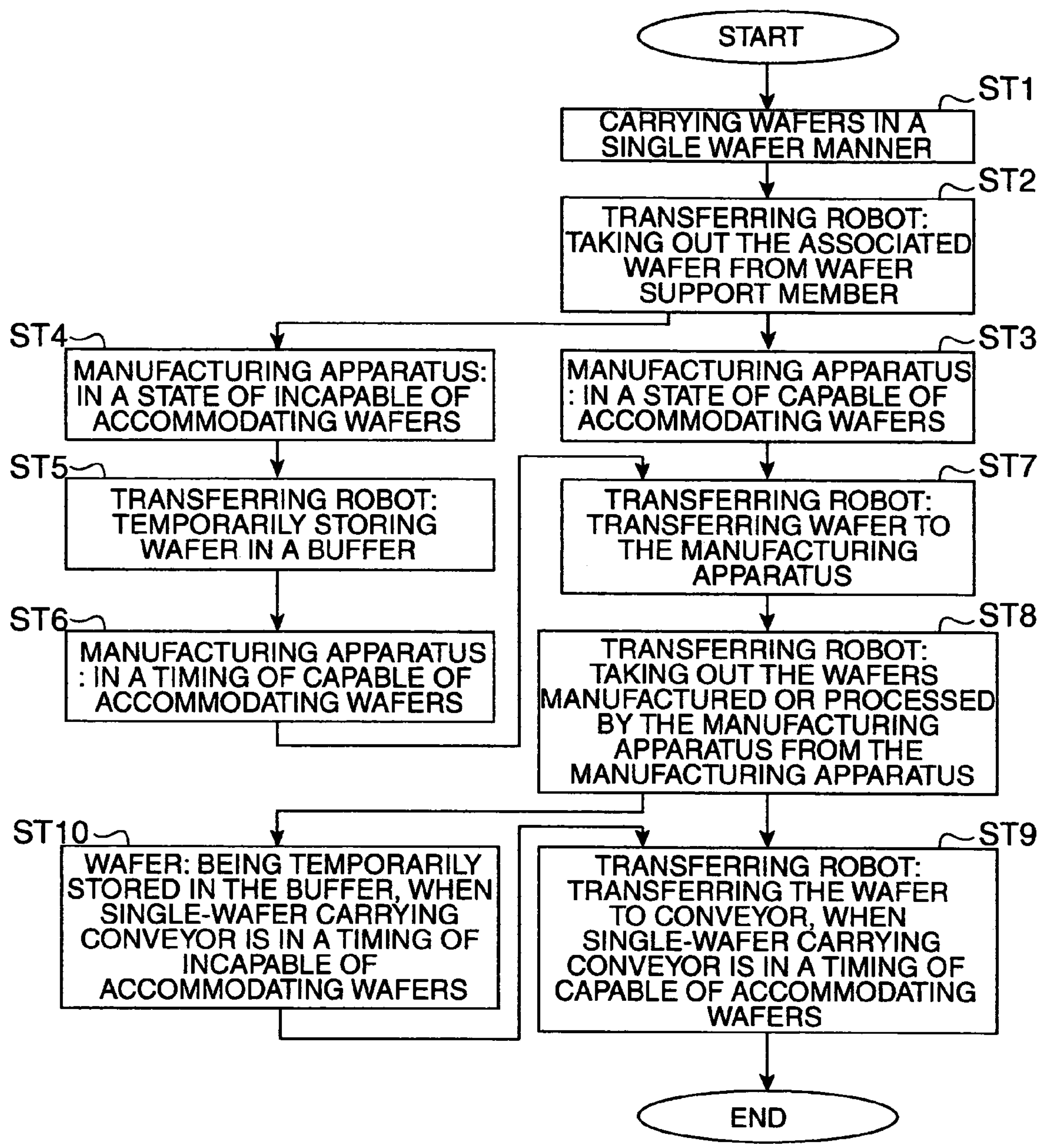
FIG. 9 is a view illustrating an example of a method of transferring a wafer in the first embodiment.

Next, the operations of the carrying system 11 having the intermediate product transferring apparatus 13 shown in FIGS. 3 to 5 will be described with reference to the flow of the operations during transferring of the wafer, as shown in FIG. 9.

First, in a step ST1 of FIG. 9, the wafer W is carried along the carrying direction T by the single-wafer carrying conveyor 20 as shown in FIG. 5.

In a step ST2 of FIG. 9, the transferring robot 21 takes out the wafer W, which is to be manufactured or processed by the manufacturing apparatus 23, from the wafer holding members 46.

In a step ST3 of FIG. 9, in case of the manufacturing apparatus 23 being capable of receiving and processing the wafer W, the transferring robot 21 hands over the wafer W to the manufacturing apparatus 23, as shown in a step ST7.

Otherwise, as shown in a step ST4 of FIG. 9, in case of the manufacturing apparatus 23 being incapable of receiving and processing the wafer W, the transferring robot 21 temporarily stores the taken-out wafer W in the buffer 34 as shown in a step ST5. And then, as shown in a step ST6, at the time that the manufacturing apparatus 23 is capable of receiving and processing the wafer W, the transferring robot 21 hands over the wafer W to the manufacturing apparatus 23 in a step ST7 of FIG. 9.

Next, as shown in a step ST8 of FIG. 9, the transferring robot 21 takes out the wafer W, which are manufactured or processed by the manufacturing apparatus 23, from the manufacturing apparatus 23.

At that time, as shown in step ST9, in the case of the single-wafer carrying conveyor 20 being capable of receiving the wafer W, the transferring robot 21 transfers the wafer W to the wafer holding members 46 of the single-wafer carrying conveyor 20.

Otherwise, as shown in a step ST10, in the case of the single-wafer carrying conveyor 20 being incapable of receiving the wafer W, the transferring robot 21 temporarily stores the wafer, which is manufactured or processed at the manufacturing apparatus 23, in the buffer 34.

As shown in the step ST9, in the case of the single-wafer carrying conveyor 20 being capable of receiving the wafer W, the transferring robot 21 mounts the wafer W on the wafer holding members 46 of the single-wafer carrying conveyor 20.

In step ST10 of FIG. 9, the case of the single-wafer carrying conveyor 20 being incapable of receiving the wafer W, is, for example, a state that it is impossible to mount the wafer W on the wafer holding members 46 of the single-wafer carrying conveyor 20, that is, a state that there is no vacant wafer holding member 46. In addition, the case includes another case that there are many wafers W to be transferred from the manufacturing apparatus 23 to the single-wafer carrying conveyor 20.

In this case, as described above, the transferring robot 21 temporarily stores the wafer W in the buffer 34, and after that, in case of capable of transferring the wafer, the wafer W is transferred to the wafer holding members 46 of the conveyor.

The load port 33 shown in FIG. 5 is used for the following cases. One of these cases is a case that the single-wafer carrying conveyor 20 shown in FIG. 5 cannot transfer the wafer W for some reason, for example. Another case for which the load port 33 is used is a case that the wafers W are to be irregularly processed. In other words, in a case that a different kind of a wafer W is to be abruptly manufactured or processed by the manufacturing apparatus 23 rather than the wafer W which is carried by the single-wafer carrying conveyor 20, the associated wafer W is mounted on the load port 33.

As a result, the transferring robot 21 is able to feed the wafer W mounted on the load port 33 to the manufacturing apparatus 23. At that time, in the case when the wafer W is mounted on the load port 33, a single wafer or multiple wafers W may be stored in a cassette, which is referred to as a FOUP. The FOUP is a kind of container for sealing and storing a single wafer or the multiple wafers W. The load port 33 comprises an opener used for opening and closing the FOUP.

Instead of the FOUP, things referred to as a cassette or a SMIF POD may be used.

SECOND EMBODIMENT

Next, a second embodiment of the carrying system of the present invention shown in FIGS. 10 to 12 will be described.

Figure 10:
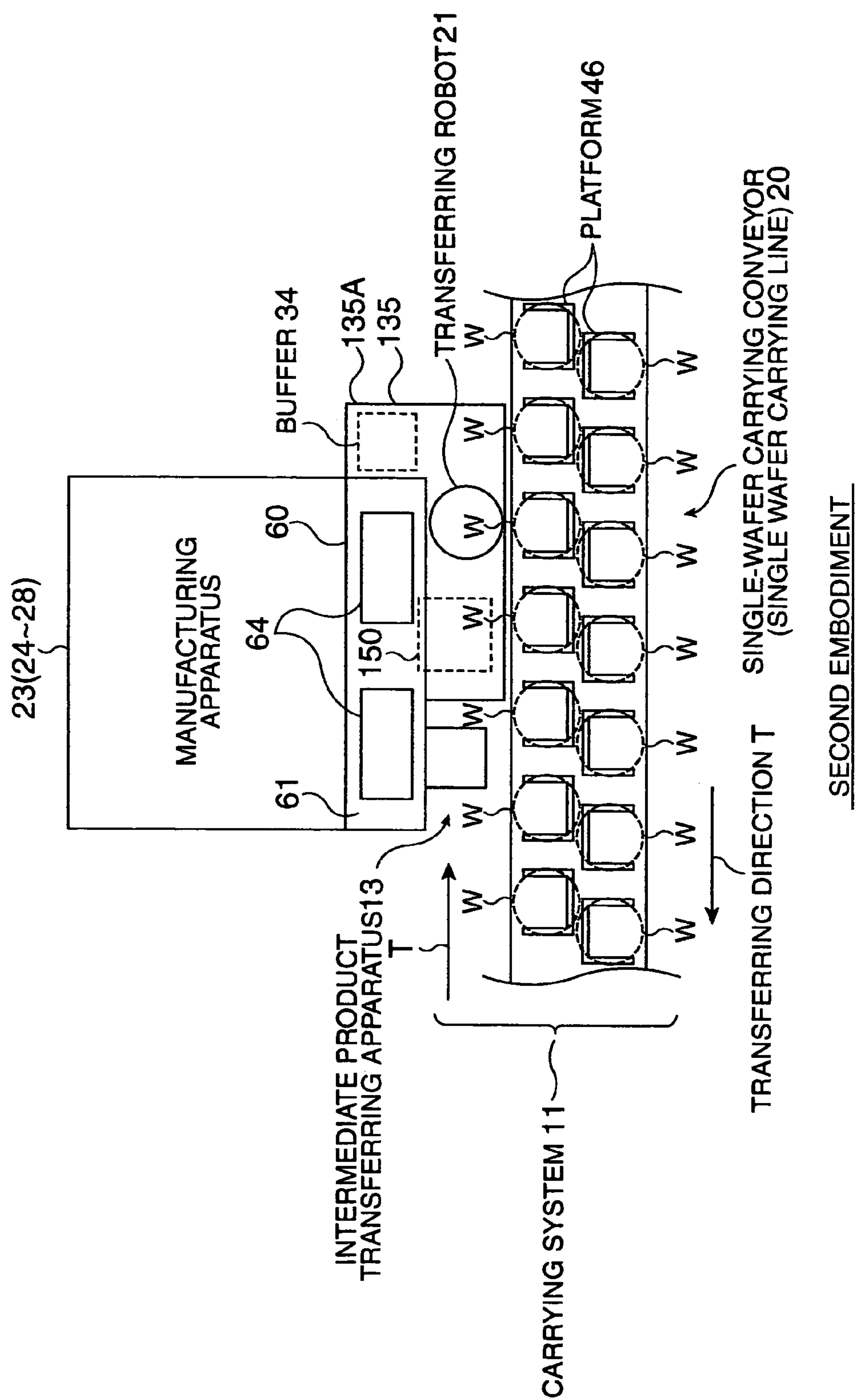
FIG. 10 is a plan view illustrating a second embodiment of the present invention.
Figure 11:
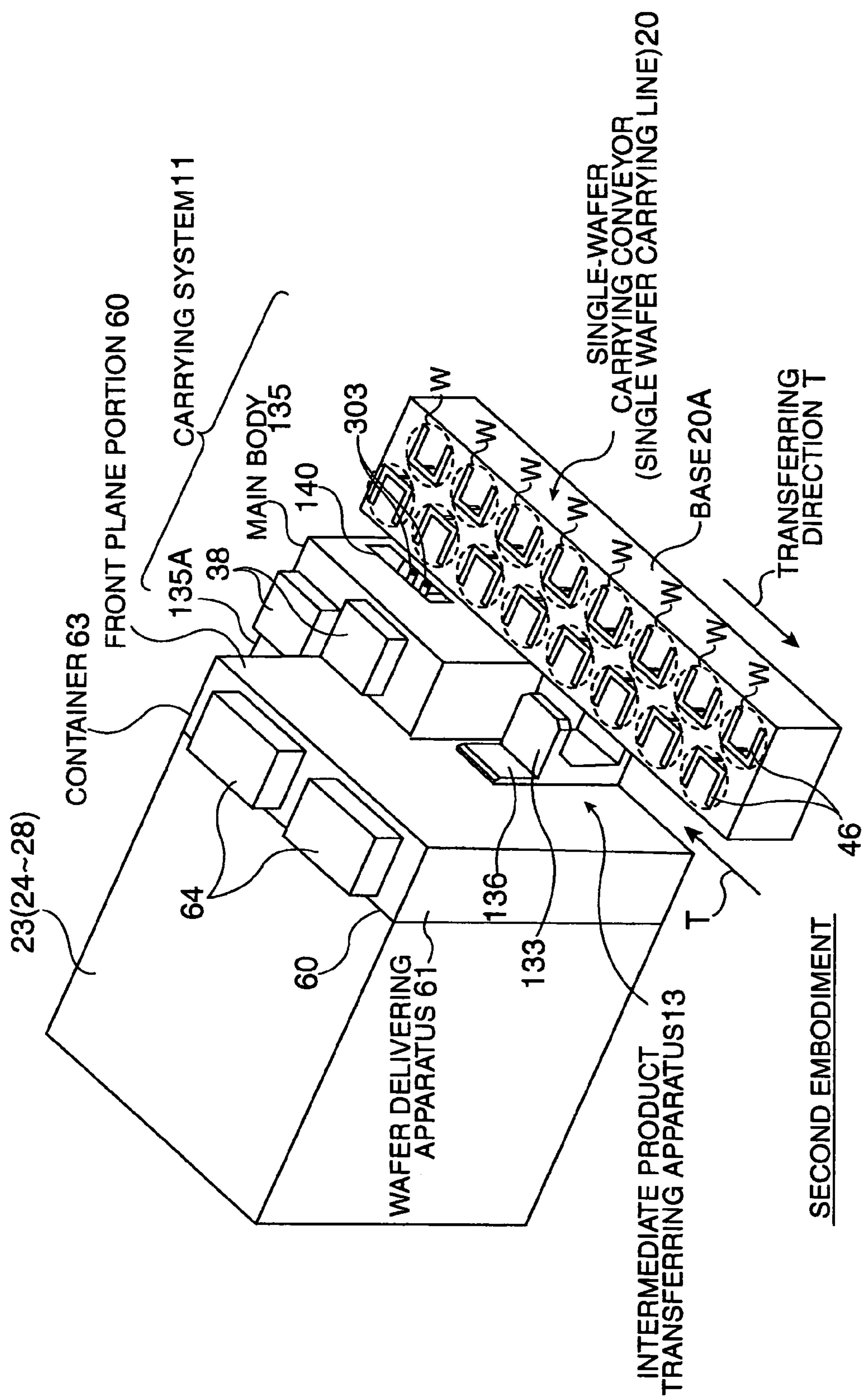
FIG. 11 is a perspective view illustrating the second embodiment of the present invention.
Figure 12:
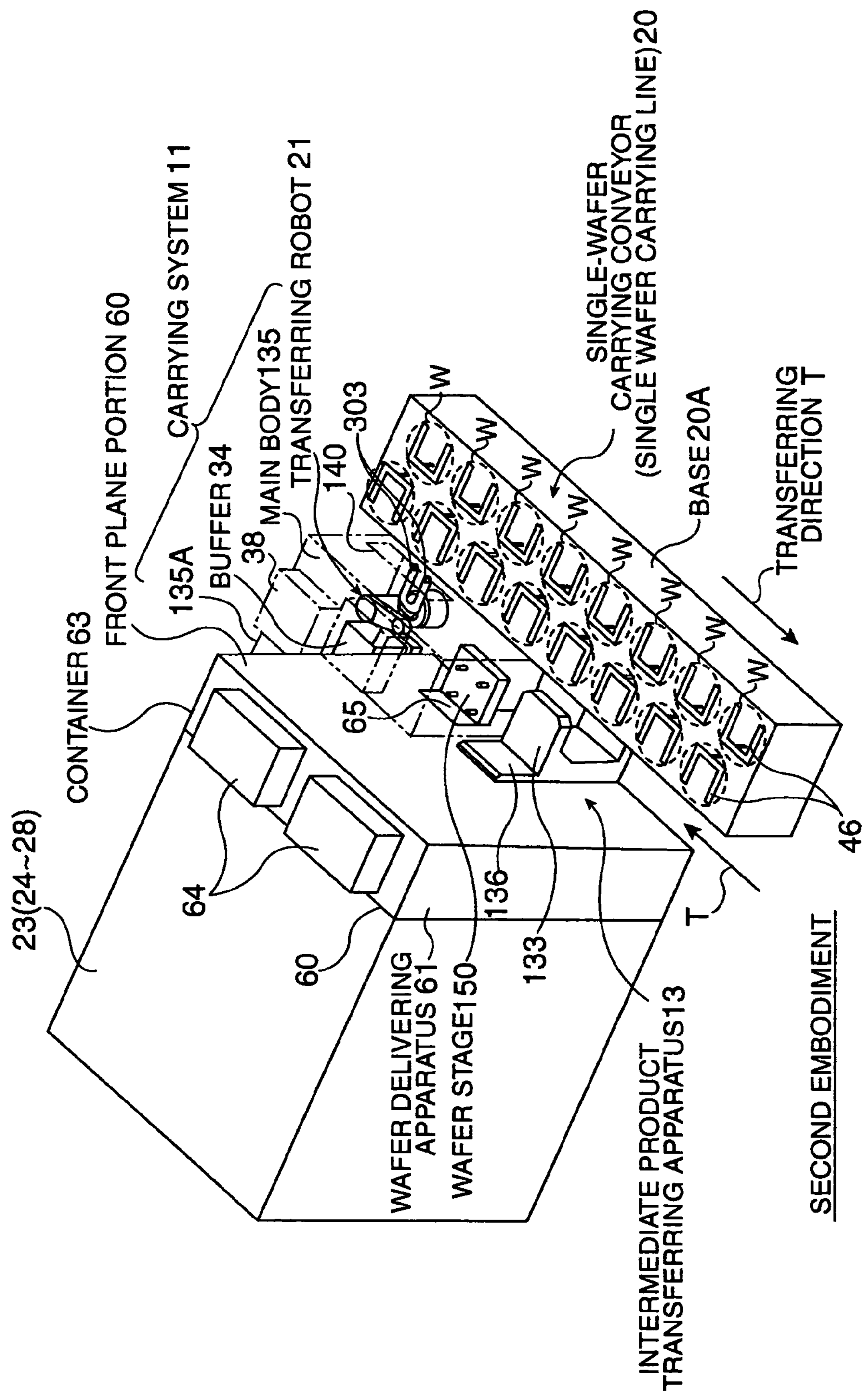
FIG. 12 is a perspective view illustrating the second embodiment of the present invention some parts of which are omitted.

The manufacturing apparatuses 23 (24 to 28) and the single-wafer carrying conveyor 20 of the second embodiment shown in FIGS. 10 to 12 have the same constructions as those of the first embodiment shown in FIGS. 3 to 5.

The carrying system 11 comprises a single-wafer carrying conveyor 20 and an intermediate product transferring apparatus 13. The intermediate product transferring apparatus 13 shown in FIGS. 10 to 12 has a different construction from the intermediate product transferring apparatus 13 shown in FIGS. 3 to 5.

For this reason, the intermediate product transferring apparatus 13 will be described. However, the description of the manufacturing apparatuses 23 (24 to 28) and the single-wafer carrying conveyor 20 will be omitted and replaced with the description of the manufacturing apparatuses 23 (24 to 28) and the single-wafer carrying conveyor 20 of FIGS. 3 to 5.

Referring to FIGS. 10 to 12, a commonly-used wafer delivering apparatus 61 is provided at the front plane portion 60 of the manufacturing apparatus 23. The wafer delivering apparatus 61 is referred to as an EFEM (equipment front end module).

The wafer delivering apparatus 61 is an existing delivering apparatus, which is previously attached to the manufacturing apparatus 23, for transferring a wafer. The embodiment of FIGS. 10 and 11 is different from the first embodiment of FIGS. 3 to 5 in that the intermediate product transferring apparatus 13 of the present invention is disposed between the existing wafer delivering apparatus 61 and the single-wafer carrying conveyor 20.

The wafer delivering apparatus 61 comprises a robot (not shown) in its own container 63. The robot performs the operation of transferring the wafer W between the intermediate product transferring apparatus 13 and the manufacturing apparatus 23. Fan-attached filter units 64 are provided on the container 63. As a result, the interior of the container 63 can be controlled at a prescribed cleanliness by down flow, for example.

The construction of the intermediate product transferring apparatus 13 will be described with reference to FIG. 12.

The main body 135 shown in FIG. 11 is illustrated with a two-dot-dashed line and its details are omitted in FIG. 12. A transferring robot 21 and a buffer 34 are provided in the main body 135. The same transferring robot 21 and the buffer 34 as the transferring robot 21 and the buffer 34 shown in FIG. 5 may be employed.

In addition, a wafer stage 150 is provided in the main body 135. The wafer stage 150 is disposed at a location corresponding to an opening 65 of the wafer delivering apparatus 61. A load port 133 is disposed at the front side of the wafer delivering apparatus 61. The load port 133 is disposed at a location corresponding to a shutter 136 of the wafer delivering apparatus 61. The load port 133 is the same as the load port 33 shown in FIG. 5.

As shown in FIGS. 10 and 12, the main body 135 is substantially L-shaped as viewed in plan. A fan-attached filter unit 38 is disposed on the top of the main body 135. The fan-attached filter unit 38 generates air flow (down flow) in an enclosed space in the main body 135. As a result, dust in the air in the interior of the main body 135 is removed, so that the interior of the main body can be controlled at a prescribed cleanliness level.

The buffer 34 is accommodated at the one end portion 135A of the main body 135. The wafer stage 150 is accommodated at the other end portion of the main body 135. The transferring robot 21 is disposed between the buffer 34 and the wafer stage 150. An opening 140 is provided at a location facing the transferring robot 21 of the main body 135 and the single-wafer carrying conveyor 20.

At least one-stage of the wafer stages 150 is provided. A sensor for sensing the presence or absence of the wafer is provided in the wafer stage 150. In case of the wafer stages 150 being provided as multiple stages, the wafer stages 150 may be used in distinction between the receiving function and the handing-over function, or they may be used without distinction between the two functions.

The reason that the wafer stage 150 is enclosed in the main body 135 of the intermediate product transferring apparatus 13 is that there is a need for transferring the wafer W mounted on the wafer stage 150 into a clean ambient (environment).

Operations of the intermediate product transferring apparatus 13 of the second embodiment shown in FIGS. 10 to 12 are substantially the same as those of the intermediate product transferring apparatus 13 shown in FIGS. 3 to 5. The intermediate product transferring apparatus 13 of the second embodiment performs the transferring of the wafer between the existing wafer delivering apparatus 61 and the wafer holding members 46 of the single-wafer carrying conveyor 20.

THIRD EMBODIMENT

Figure 13:
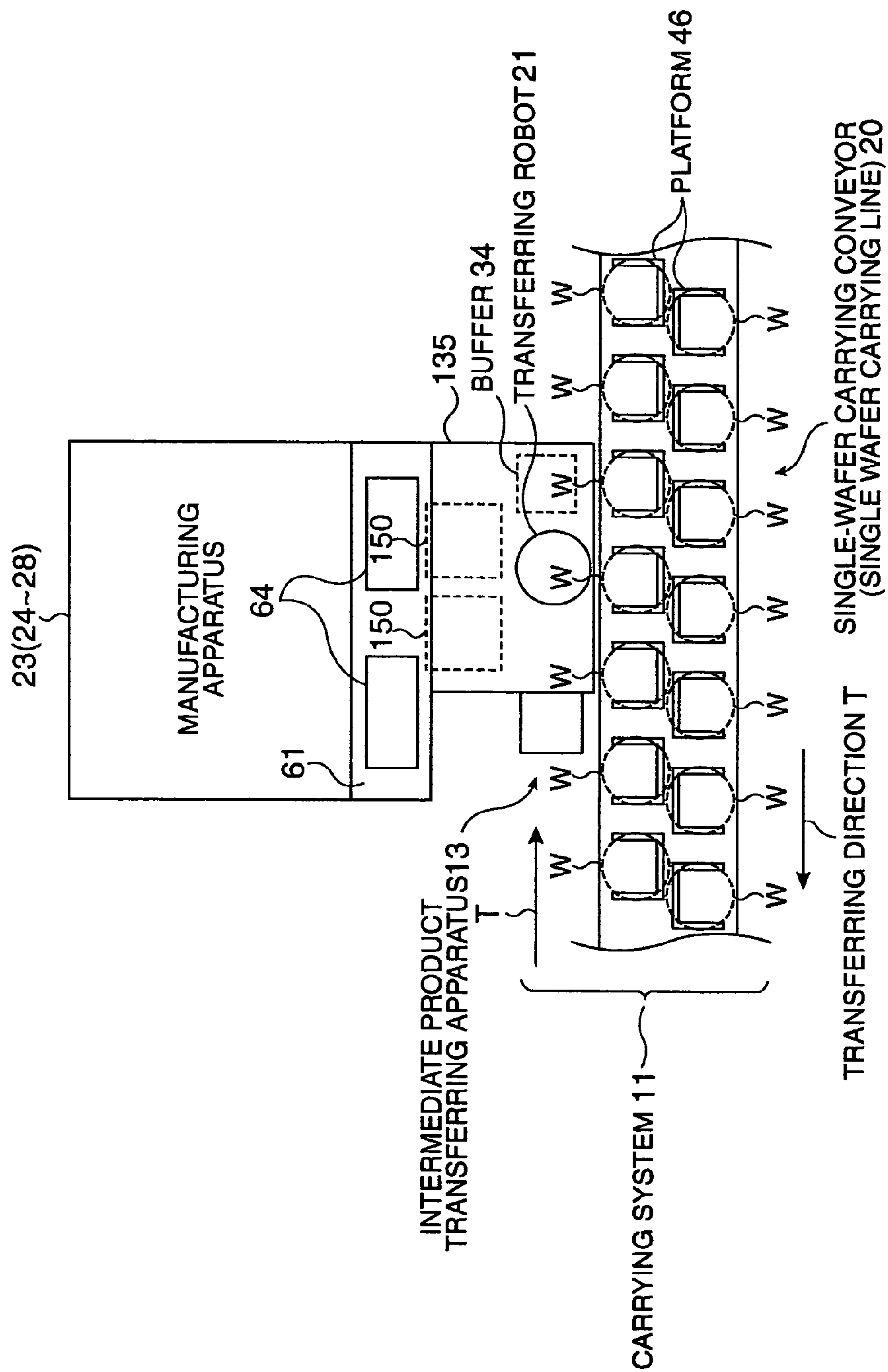
FIG. 13 is a plan view illustrating a third embodiment of the present invention.
Figure 14:
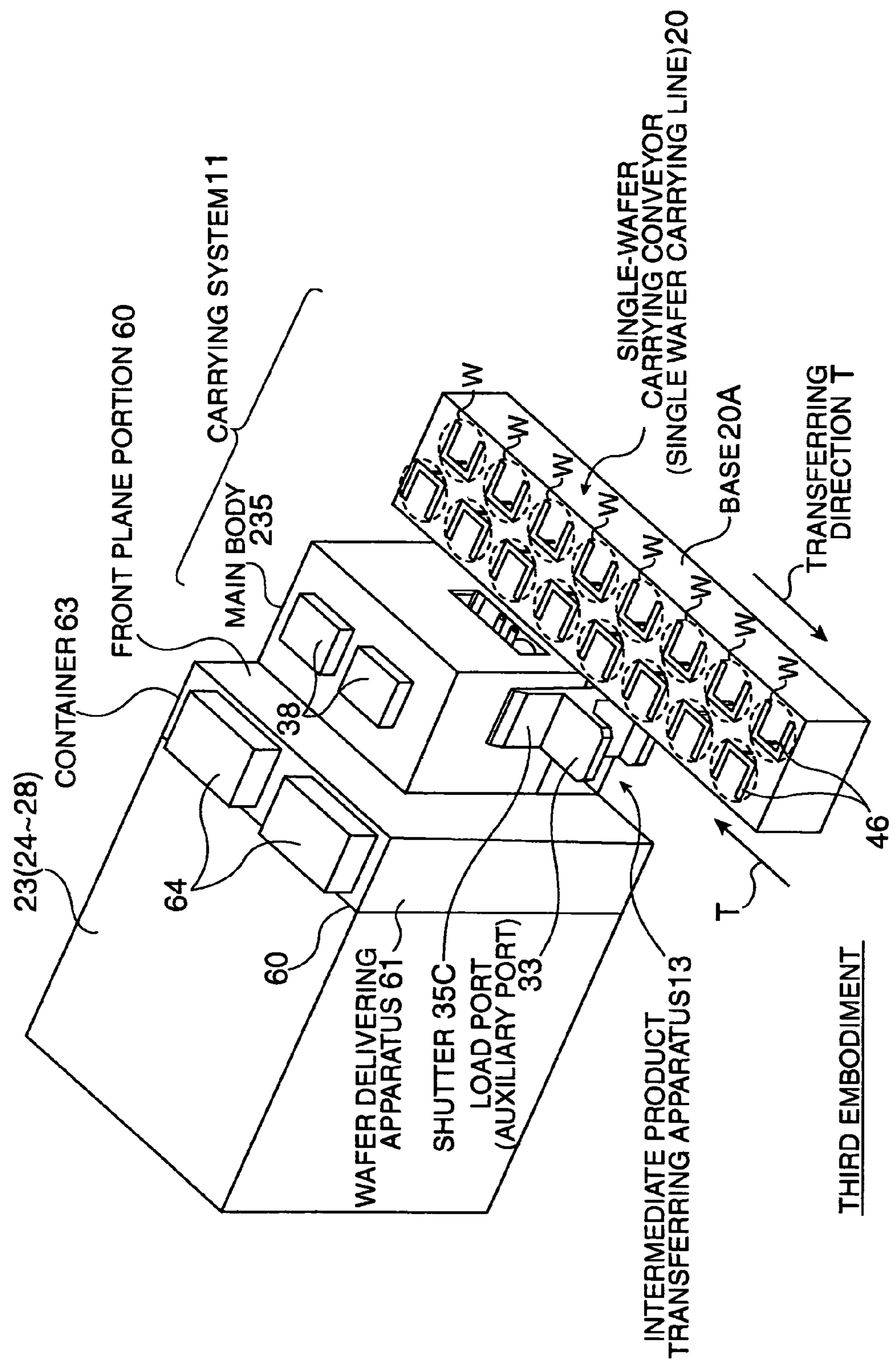
FIG. 14 is a perspective view illustrating the third embodiment of the present invention.
Figure 15:
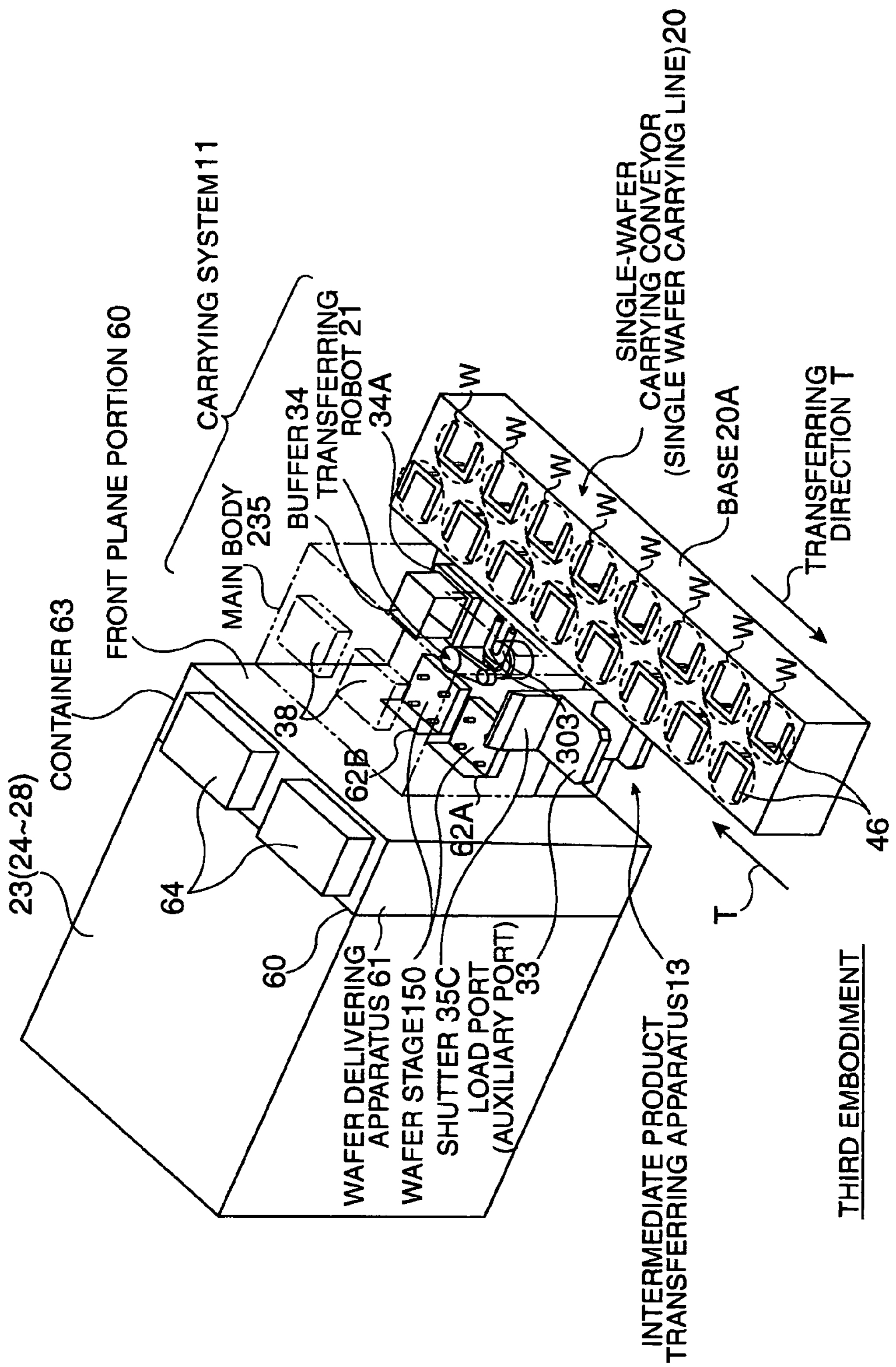
FIG. 15 is a perspective view illustrating the third embodiment of the present invention some parts of which are omitted.

FIGS. 13 to 15 illustrate a third embodiment of the carrying system of the present invention.

The components of the third embodiment shown in FIGS. 13 to 15 having the same constructions as those of the second embodiment shown in FIGS. 10 to 12 are the manufacturing apparatuses 23 (24 to 28), the wafer delivering apparatus 61, and the single-wafer carrying conveyor 20. The construction of the intermediate product transferring apparatus 13 of the third embodiment in FIGS. 13 to 15 is slightly different from that of the intermediate product transferring apparatus 13 of the second embodiment shown in FIGS. 10 to 12.

Accordingly, the construction of the intermediate product transferring apparatus 13 shown in FIGS. 13 to 15 will be described.

As shown in FIGS. 13 to 15, the intermediate product transferring apparatus 13 comprises a main body 235. The main body 235 is rectangular as viewed in plane. A fan-attached filter unit 38 is disposed on the top of the main body 235. The fan-attached filter unit 38 generates air flow (down flow) in an enclosed space in the main body 235. As a result, dust in the air in the interior of the main body 235 is removed, so that the interior of the main body can be controlled at a prescribed cleanliness level.

The main body 235 accommodates a transferring robot 21, a buffer 34, and two wafer stages 150. A load port 33 is disposed at one side of the main body 235. At the time of opening a shutter 35C, the wafer W mounted on the load port 33 is arranged so that the transferring robot 21 can transfer the wafer W from the wafer delivering apparatus 61.

The transferring robot 21, the load port 33, and the buffer 34 are serially disposed along the carrying direction T on the single-wafer carrying conveyor 20. The two wafer stages 150 are provided at the front side of the wafer delivering apparatus 61.

In both the second embodiment shown in FIGS. 10 to 12 and the third embodiment shown in FIGS. 13 to 15, the intermediate product transferring apparatus 13 is disposed between the single-wafer carrying conveyor 20 and the existing wafer delivering apparatus 61 which is previously attached to the manufacturing apparatus 23.

In all of the aforementioned first to third embodiments, the intermediate product transferring apparatuses 13 may be referred to as transferring units. The intermediate product transferring apparatus 13 preferably comprises at least the aforementioned buffer 34 and transferring robot 21. The transferring robot 21 may be referred to as a wafer transferring robot. The intermediate product transferring apparatus 13 preferably comprises the following apparatuses besides the aforementioned buffer 34 and transferring robot 21.

Namely, the transferring apparatus 13 comprises a mechanism for aligning a notch of the wafer and an ID recognition apparatus for recognizing an ID (identification symbol). The mechanism for aligning the notch may be referred to as a wafer orientatia or a mounted-on-robot notch alignment mechanism. The ID recognition apparatus is, for example, disposed on the transferring robot so as to recognize kinds of the wafers when the wafers W are transferred. The ID recognition apparatus may be disposed at a different location from that of the intermediate product transferring apparatus 13.

In this case, the wafer W is carried into a separately-provided ID recognition apparatus, in which a kind of the wafer W is recognized.

The mechanism for performing orientation (or aligning the notch) of the wafer is preferably provided at the top of the buffer, for example. The buffer has the function of temporarily storing a single wafer or multiple wafers. A sensor for sensing the presence or absence of the wafer is attached on the buffer.

The load port is used in case of an operator manually feeding the wafer. In this case, the wafer is mounted on the load port by using the FOUP, for example. The case of using the load port includes the following cases. One case is that there is a problem in the single-wafer carrying conveyor 20 and, for example, the single-wafer carrying is impossible. Another case is that a test wafer in an arbitrary lot is interjected in the manufacturing apparatus in order to check the state of the manufacturing apparatus after its maintenance.

In one embodiment of the present invention, the intermediate product transferring apparatus 13 of the present invention is disposed between the single-wafer carrying line and the manufacturing apparatus (which may be referred to as a production apparatus or a processing apparatus). The intermediate product transferring apparatus 13 may directly transfer the wafer between the single-wafer carrying line 20 and the manufacturing apparatuses 23 (24 to 28).

In the case when the wafer is transferred from the single-wafer carrying line to the manufacturing apparatus, the buffer may temporarily store the wafer which is carried in a single-wafer manner or the wafer which is processed in the manufacturing apparatus.

In addition, in another embodiment of the present invention, the intermediate product transferring apparatus 13 of the present invention is disposed between the single-wafer carrying line 20 and the wafer delivering apparatus 61 which is standardly attached to the manufacturing apparatus. Even in this case, the intermediate product transferring apparatus 13 may transfer the wafer between the single-wafer carrying line and the wafer delivering apparatus. The buffer may temporarily store the wafer which is carried in a single-wafer manner or the wafer which is processed in the manufacturing apparatus.

Accordingly, the transferring robot transfers the intermediate product between the single-wafer carrying line and the manufacturing apparatus. The buffer temporarily stores the intermediate product which is transferred from the single-wafer carrying line by the transferring robot or the intermediate product which is processed by the manufacturing apparatus.

As a result, the intermediate product, which is transferred from the single-wafer carrying line by the transferring robot, is temporarily stored in the buffer, whereby the time (timing) when the intermediate product is sent to the manufacturing apparatus can be delayed. Similarly, the intermediate product, which is processed by the manufacturing apparatus, is temporarily stored in the buffer, whereby the time (timing) when the processed intermediate product is sent to the carrying line by the transferring robot can be delayed. In other words, a pres-selected timing can be waited for prior to sending the processed intermediate product to the carrying line or to the manufacturing apparatus.

Accordingly, in the transferring (delivering) of the intermediate product between the single-wafer carrying line and the manufacturing apparatus, even in the case that the number of intermediate products which are carried by the single-wafer carrying line is different from the number of intermediate products which are able to be processed in the manufacturing apparatuses, the transferring of the intermediate product can be rapidly and accurately performed. Furthermore, since the intermediate product transferred from the single-wafer carrying line by the transferring robot, or the intermediate product processed by the manufacturing apparatus is temporarily stored in the buffer, the single-wafer carrying line need not be stopped, whereby it is possible to prevent the carrying capability from being lowered. Since the manufacturing apparatus can manufacture the intermediate products in accordance with the process capability of the manufacturing apparatus, it is possible to continuously perform production without the productivity being deteriorated and the production efficiency being lowered.

The intermediate product is an electronic component manufacturing substrate or a wafer for a substrate. The buffer is a shelf-shaped structure (e.g., a platform). However, instead of the shelf-shaped structure, the buffer may be a cartridge. The structure is capable of accommodating a plurality of the intermediate products and is disposed near the transferring robot.

As a result, since the buffer is disposed near the transferring robot, the area occupied by the intermediate product transferring apparatus (viewed in plan) can be extremely reduced.

In addition, an auxiliary port is further provided in order to mount the intermediate product. For example, a container, in which a plurality of the intermediate products is accommodated, is manually mounted on the auxiliary port by an operator. The case of using the auxiliary port includes, for example, cases that some failure occurs in the single-wafer carrying line. In these cases, the operator manually mounts the container such as a cassette, in which the intermediate products are accommodated, on the auxiliary port. As a result, the transferring robot can transfer the intermediate products from the container mounted on the auxiliary port to the manufacturing apparatus.

In an embodiment of the present invention, since the intermediate product transferring apparatus 13 may directly transfer the wafer between the single-wafer carrying line and the manufacturing apparatuses, it is possible to reduce the time required for transferring wafers. Since the buffer is provided, the wafers which are carried in a single-wafer manner may be sequentially inserted and the wafers which are processed by the manufacturing apparatuses may be sequentially ejected. As a result, the inserting and ejecting operations for the wafers can be smoothly performed. Therefore, the semiconductor manufacturing apparatus can continuously perform production without deterioration of its production capability.

The intermediate product transferring apparatus used in an embodiment of the present invention can be used to transfer wafers between various kinds of manufacturing apparatuses and the single-wafer transferring conveyer. As a result, modifications of the semiconductor manufacturing apparatuses and reconstruction of the control software are satisfactorily performed within a small range, so that the rise in cost of the semiconductor manufacturing apparatuses can be prevented.

In the aforementioned embodiments of the present invention, one example of the intermediate products is a semiconductor wafer W. However, it is not limited thereto. For example, the intermediate product may be an electronic component manufacturing substrate such as a quartz device manufacturing substrate or a wafer for a substrate such as a substrate wafer used for a liquid crystal display apparatus.

The transferring robot 21 is a type of robot having an arm. The transferring robot 21 may be a type of robot for transferring a wafer by moving in a horizontal direction. The number of the transferring robots may be one or more.

In the aforementioned embodiments of the present invention, the intermediate product is an electronic component manufacturing substrate or a wafer for a substrate. The buffer is preferably a shelf-shaped structure which is capable of accommodating a plurality of the intermediate products and is disposed near the transferring robot.

According to the construction, the intermediate product such as a wafer is an electronic component manufacturing substrate or a wafer for a substrate. The buffer is a shelf-shaped structure. The structure is capable of detachably accommodating, for example, a plurality of the intermediate products, and is disposed near the transferring robot. While the buffer is preferably the shelf-shaped structure, the buffer may be constructed in a completely fixed state. Otherwise, the buffer may be constructed by temporarily fixing a container such as a cassette to which wafers is simply detachably accommodated. The container is, for example, preferably a cassette.

The present invention is not limited to the aforementioned embodiments and various modifications can be made without departing from the scope of the claims.

The constructions of the aforementioned embodiments may be partially omitted or arbitrarily combined to be changed into other constructions.

What is claimed is:

1. An intermediate product transferring apparatus for transferring an intermediate product between a single-wafer carrying line for carrying the intermediate product in a single-wafer manner and a manufacturing apparatus for manufacturing the intermediate product comprising:

a transferring robot disposed between the single-wafer carrying line and the manufacturing apparatus, the transferring robot transferring the intermediate product between the single-wafer carrying line and the manufacturing apparatus; and a buffer accessible to the transferring robot, the buffer temporarily storing the intermediate product while at least one of the manufacturing apparatus and the single-wafer carrying line are incapable of accommodating the intermediate product;

wherein the intermediate product is transferred by the transferring robot in a single-wafer manner from at least one of the single-wafer carrying line and the manufacturing apparatus to the buffer;

wherein the single wafer carrying line includes a plurality of single wafer holding members disposed on a base and enclosed in a clean tunnel with fan-attached filter units, the plurality of single wafer holding members being arranged along a carrying direction of the single-wafer carrying line; and wherein the transferring robot includes a hand with support members that support an outer circumferential edge of the intermediate product when the intermediate product is transferred by the transferring robot.

2. The intermediate product transferring apparatus according to claim 1, wherein the intermediate product comprises an electronic component manufacturing substrate or a wafer for a substrate, and wherein the buffer comprises a shelf-shaped structure, which is capable of accommodating a plurality of the intermediate products, accessible to the transferring robot.

3. The intermediate product transferring apparatus according to claim 1, wherein the intermediate product transferring apparatus further comprises an auxiliary port for mounting the intermediate product, and wherein the auxiliary port is accessible to the transferring robot.

4. An intermediate product transferring apparatus for transferring an intermediate product between a single-wafer carrying line for carrying the intermediate product in a single-wafer manner and an intermediate product delivering apparatus which is attached to a manufacturing apparatus for manufacturing the intermediate product comprising:

a transferring robot disposed between the single-wafer carrying line and the intermediate product delivering apparatus, the transferring robot transferring the intermediate product between the single-wafer carrying line and the intermediate product delivering apparatus; and a buffer accessible to the transferring robot, the buffer temporarily storing the intermediate product while at least one of the intermediate product delivering apparatus and the single-wafer carrying line are incapable of accommodating the intermediate product;

wherein the intermediate product is transferred by the transferring robot in a single-wafer manner from at least one of the single-wafer carrying line and the intermediate product delivering apparatus to the buffer;

wherein the single wafer carrying line includes a plurality of single wafer holding members disposed on a base and enclosed in a clean tunnel with fan-attached filter units, the plurality of single wafer holding members being arranged along a carrying direction of the single-wafer carrying line; and wherein the transferring robot includes a hand with support members that support an outer circumferential edge of the intermediate product when the intermediate product is transferred by the transferring robot.

5. The intermediate product transferring apparatus according to claim 4, wherein the intermediate product comprises an electronic component manufacturing substrate or a wafer for a substrate, and wherein the buffer comprises a shelf-shaped structure, which is capable of accommodating a plurality of the intermediate products, accessible to the transferring robot.

6. The intermediate product transferring apparatus according to claim 4, wherein the intermediate product transferring apparatus further comprises an auxiliary port for mounting the intermediate product, and wherein the auxiliary port is accessible to the transferring robot.

7. A carrying system for transferring an intermediate product between a carrying line for carrying the intermediate product and a manufacturing apparatus for manufacturing the intermediate product, comprising:

a single-wafer carrying line for carrying the intermediate product in a single-wafer manner; and a transferring apparatus for transferring the intermediate product between the single-wafer carrying line and the manufacturing apparatus for manufacturing the intermediate product, wherein the single-wafer carrying line includes a plurality of single wafer holding members disposed on a base and enclosed in a clean tunnel with fan-attached filter units, the plurality of single wafer holding members being arranged along a carrying direction of the single-wafer carrying line, wherein the transferring apparatus for transferring the intermediate product comprises:

a transferring robot disposed between the single-wafer carrying line and the manufacturing apparatus, the transferring robot transferring the intermediate product between the single-wafer carrying line and the manufacturing apparatus, the transferring robot including a hand with support members that support an outer circumferential edge of the intermediate product when the intermediate product is transferred by the transferring robot; and a buffer accessible to the transferring robot for temporarily storing the intermediate product while at least one of the manufacturing apparatus and the single-wafer carrying line are incapable of accommodating the intermediate product;

wherein the intermediate product is transferred by the transferring robot in a single-wafer manner from at least one of the single-wafer carrying line and the manufacturing apparatus to the buffer.

8. A carrying system for transferring an intermediate product between a carrying line for carrying the intermediate product and an intermediate product delivering apparatus which is previously attached to a manufacturing apparatus for manufacturing the intermediate product, comprising:

a single-wafer carrying line for carrying the intermediate product in a single-wafer manner, the single-wafer carrying line including a plurality of single wafer holding members disposed on a base and enclosed in a clean tunnel with fan-attached filter units, the plurality of single wafer holding members being arranged along a carrying direction of the single-wafer carrying line; and a transferring apparatus for transferring the intermediate product between the single-wafer carrying line and the intermediate product delivering apparatus, wherein the transferring apparatus for transferring the intermediate product comprises:

a transferring robot disposed between the single-wafer carrying line and the intermediate product delivering apparatus, the transferring robot transferring the intermediate product between the single-wafer carrying line and the intermediate product delivering apparatus, the transferring robot including a hand with support members that support an outer circumferential edge of the intermediate product when the intermediate product is transferred by the transferring robot; and a buffer accessible to the transferring robot for temporarily storing the intermediate product while at least one of the intermediate product delivering apparatus and the single-wafer carrying line are incapable of accommodating the intermediate product;

wherein the intermediate product is transferred by the transferring robot in a single-wafer manner from at least one of the single-wafer carrying line and the intermediate product delivering apparatus to the buffer.

* * * * *